United States Patent [19]

Scepanovic et al.

[11] Patent Number: 6,038,385
[45] Date of Patent: *Mar. 14, 2000

[54] PHYSICAL DESIGN AUTOMATION SYSTEM AND PROCESS FOR DESIGNING INTEGRATED CIRCUIT CHIP USING "CHESSBOARD" AND "JIGGLE" OPTIMIZATION

[75] Inventors: Ranko Scepanovic; James S. Koford, both of San Jose, Calif.; Alexander E. Andreev, Moskovskaja Oblast, Russian Federation; Ivan Pavisic, Cupertino, Calif.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/609,397

[22] Filed: Mar. 1, 1996

[51] Int. Cl.[7] ................................................ G06F 17/50

[52] U.S. Cl. ........................ 395/500.08; 395/500.09; 395/500.1; 395/500.11; 395/500.03

[58] Field of Search ............................ 364/488–491; 257/207; 395/500.08, 500.09, 500.1, 500.11, 500.03

[56] References Cited

U.S. PATENT DOCUMENTS

| | | | |
|---|---|---|---|
| 5,495,419 | 2/1997 | Rostoker et al. | 364/468.28 |
| 5,578,840 | 11/1996 | Scepanovis et al. | 257/207 |
| 5,587,923 | 12/1996 | Wang | 395/500.14 |

OTHER PUBLICATIONS

Doll et al. "Interative placement Improvements by Network Flow Methods," IEEE, 1994, pp. 1189–1200.

Kling et al., "Optimization by Simulated Evolution with Applications to Standard Cell Placement," Ieee, 1990, pp. 20–25.

Glaswacher et al., "A Genetic Algorithm for Global Improvement of Marschall layouts," Ieee, 1991, pp. 306–313.

Primary Examiner—Kevin J. Teska
Assistant Examiner—Vuthe Siek
Attorney, Agent, or Firm—Mitchell, Silberberg & Knupp LLP

[57] ABSTRACT

A cell placement for an integrated circuit chip is divided into two "chessboard" patterns or "jiggles". Each pattern resembles a chessboard in that it consists of alternating regions of different types or "colors" such that no region of a given color has an edge common with another region of the same color. The jiggles are offset relative to each other such that the regions of one jiggle partially overlap at least two regions of the other jiggle. A placement improvement operation such as simulated annealing is performed sequentially for each color of each jiggle. During each operation, a plurality of parallel processors operate on the regions simultaneously using a previous copy of the entire chip, with one processor being assigned to one or more regions. At the end of each operation, the copy of the chip is updated. The chessboard patterns eliminate unproductive cell moves resulting from adjacent regions having a common edge. The jiggles enable cells to move to their optimal positions from their initial region to any other region on the chip. The regions can have rectangular, triangular or hexagonal shapes.

46 Claims, 17 Drawing Sheets

FIG. 10
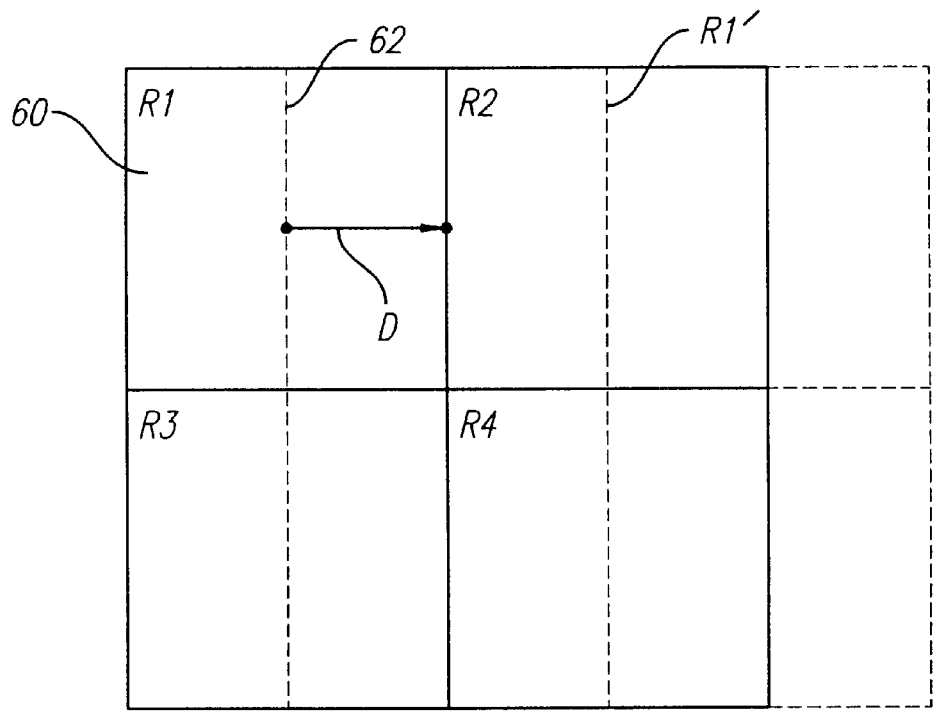
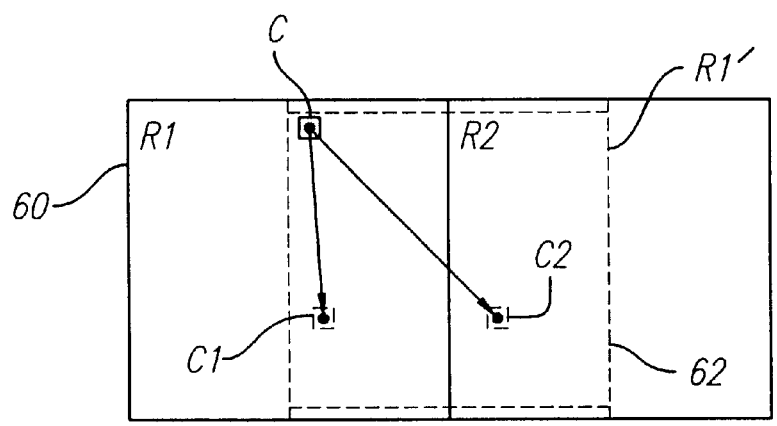
FIG. 11

PHYSICAL DESIGN AUTOMATION SYSTEM AND PROCESS FOR DESIGNING INTEGRATED CIRCUIT CHIP USING "CHESSBOARD" AND "JIGGLE" OPTIMIZATION

BACKGROUND OF THE INVENTION

1. Field of the Invention

The present invention generally relates to the art of microelectronic integrated circuits, and more specifically to a physical design automation system and process for designing integrated circuit chips using "chessboard" and "sieve" optimization.

2. Description of the Related Art

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality. Since space on a wafer is very expensive real estate, algorithms must use the space very efficiently to lower costs and improve yield. The arrangement of individual cells in an integrated circuit chip is known as a cell placement.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

Prior art methods for achieving this goal comprise generating one or more initial placements, modifying the placements using optimization methodologies including genetic algorithms such as simulated evolution, force directed placement or simulated annealing, and comparing the resulting placements using a cost criteria.

A major drawback of these prior art methodologies as implemented using a conventional digital computer is their sequential nature. Since integrated circuits commonly include hundreds of thousands of cells that must be placed and routed, computer run times are unacceptably long for practical commercial applications.

Attempts have been made to overcome the limitations of prior art algorithms by dividing a chip into a number of regions, and simultaneously optimizing the placements inside the regions using respective parallel processors. Each processor has its own copy of the chip, and works only in the region(s) to which it is assigned. There is another, master copy of the chip which is updated periodically to reflect the changes in the individual regions.

A major problem inherent in this approach is that, during one period between two consecutive updates of the master copy, a processor working in a given region does not see the changes being made in the other regions by the other processors, and bases all placement change decisions on the cell positions in the previous master copy.

The drawbacks of the prior art are illustrated in FIGS. 3a and 3b. A net N interconnects cells C1 and C2 which are located in regions R1 and R2 of an integrated circuit chip. A goal of the placement optimization is to minimize the total wirelength of the placement.

The processor working in the region R1 sees the cell C2 in the previous master copy of the chip, and moves the cell C1 toward the cell C2 in the direction of an arrow D1 to reduce the length of the net N. Similarly, the processor working in the region R2 sees the cell C1 in the previous master copy of the chip, and moves the cell C2 toward the cell C1 in the direction of an arrow D2 to reduce the length of the net N.

The result is illustrated in FIG. 3b. The positions of the cells C1 and C2 have been essentially reversed with relation to each other, and the length of the net N is substantially unchanged.

Another limitation of the prior art is that with optimization being performed locally within a plurality of regions, a cell is not able to be moved from one region to another even though the optimal position for the cell is in a region far remote from the region in which it is initially located.

SUMMARY OF THE INVENTION

The present invention overcomes the drawbacks of the prior art by parallelizing the placement improvement operation such that changes in two regions of an integrated circuit chip do not produce an undesirable increase in the length of wiring interconnecting the regions, and allowing a cell to be moved from one region to any other region on the chip.

In accordance with the present invention, a cell placement for an integrated circuit chip is divided into two "chessboard" patterns or "jiggles". Each pattern resembles a chessboard in that it consists of alternating regions of different types or "colors", such that no region of a given color has an edge common with another region of the same color.

The jiggles are offset relative to each other such that the regions of one jiggle partially overlap at least two regions of the other jiggle. A placement improvement operation such as simulated annealing is performed sequentially for each color of each jiggle.

During each operation, a plurality of parallel processors operate on the regions simultaneously using a previous copy of the entire chip, with one processor being assigned to one or more regions. At the end of each operation, the copy of the chip is updated.

The chessboard patterns eliminate unproductive cell moves resulting from adjacent regions having a common edge. The jiggles enable cells to move to their optimal positions from their initial region to any other region on the chip. The regions can have rectangular, triangular or hexagonal shapes.

These and other features and advantages of the present invention will be apparent to those skilled in the art from the following detailed description, taken together with the accompanying drawings, in which like reference numerals refer to like parts.

DESCRIPTION OF THE DRAWINGS

FIG. 10 is a diagram illustrating how the jiggle of FIG. 6 can be translated horizontally from the jiggle of FIG. 5;

FIG. 11 is a diagram illustrating how a cell in one region can be moved to any of two adjacent regions;

DETAILED DESCRIPTION OF THE INVENTION

Figure 1:
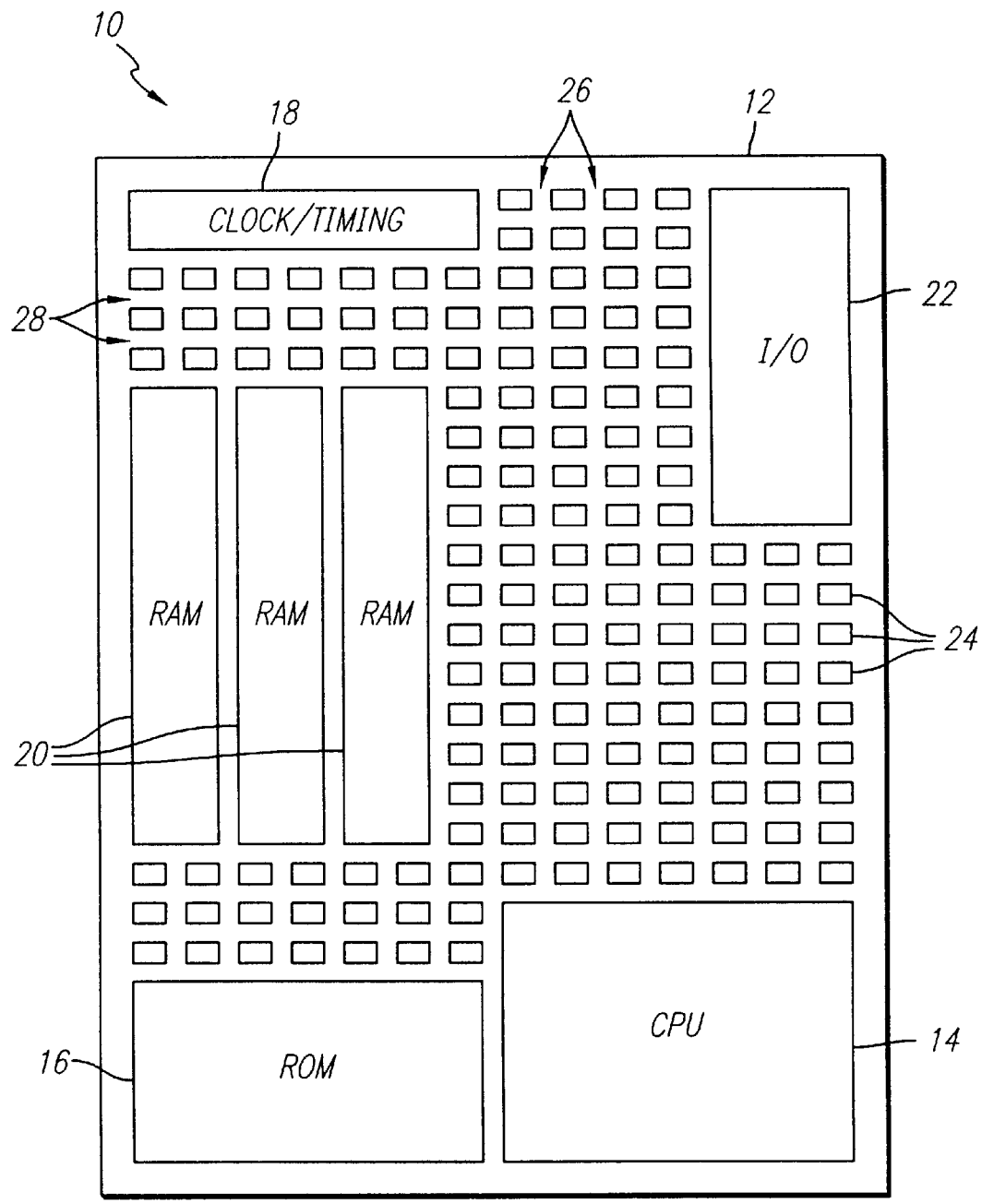
FIG. 1 is a simplified diagram illustrating an integrated circuit chip which can be optimally designed in accordance with the present invention.

An exemplary integrated circuit chip is illustrated in FIG. 1 and generally designated by the reference numeral 10. The circuit 10 includes a semiconductor substrate 12 on which are formed a number of functional circuit blocks that can have different sizes and shapes. Some are relatively large, such as a central processing unit (CPU) 14, a read-only memory (ROM) 16, a clock/timing unit 18, one or more random access memories (RAM) 20 and an input/output (I/O) interface unit 22. These blocks can be considered as modules for use in various circuit designs, and are represented as standard designs in circuit libraries.

The integrated circuit 10 further comprises a large number, which can be tens of thousands, hundreds of thousands or even millions or more of small cells 24. Each cell 24 represents a single logic element, such as a gate, or several logic elements that are interconnected in a standardized manner to perform a specific function. Cells 24 that consist of two or more interconnected gates or logic elements are also available as standard modules in circuit libraries.

The cells 24 and the other elements of the circuit 10 described above are interconnected or routed in accordance with the logical design of the circuit to provide the desired functionality. Although not visible in the drawing, the various elements of the circuit 10 are interconnected by electrically conductive lines or traces that are routed, for example, through vertical channels 26 and horizontal channels 28 that run between the cells 24.

Figure 2:
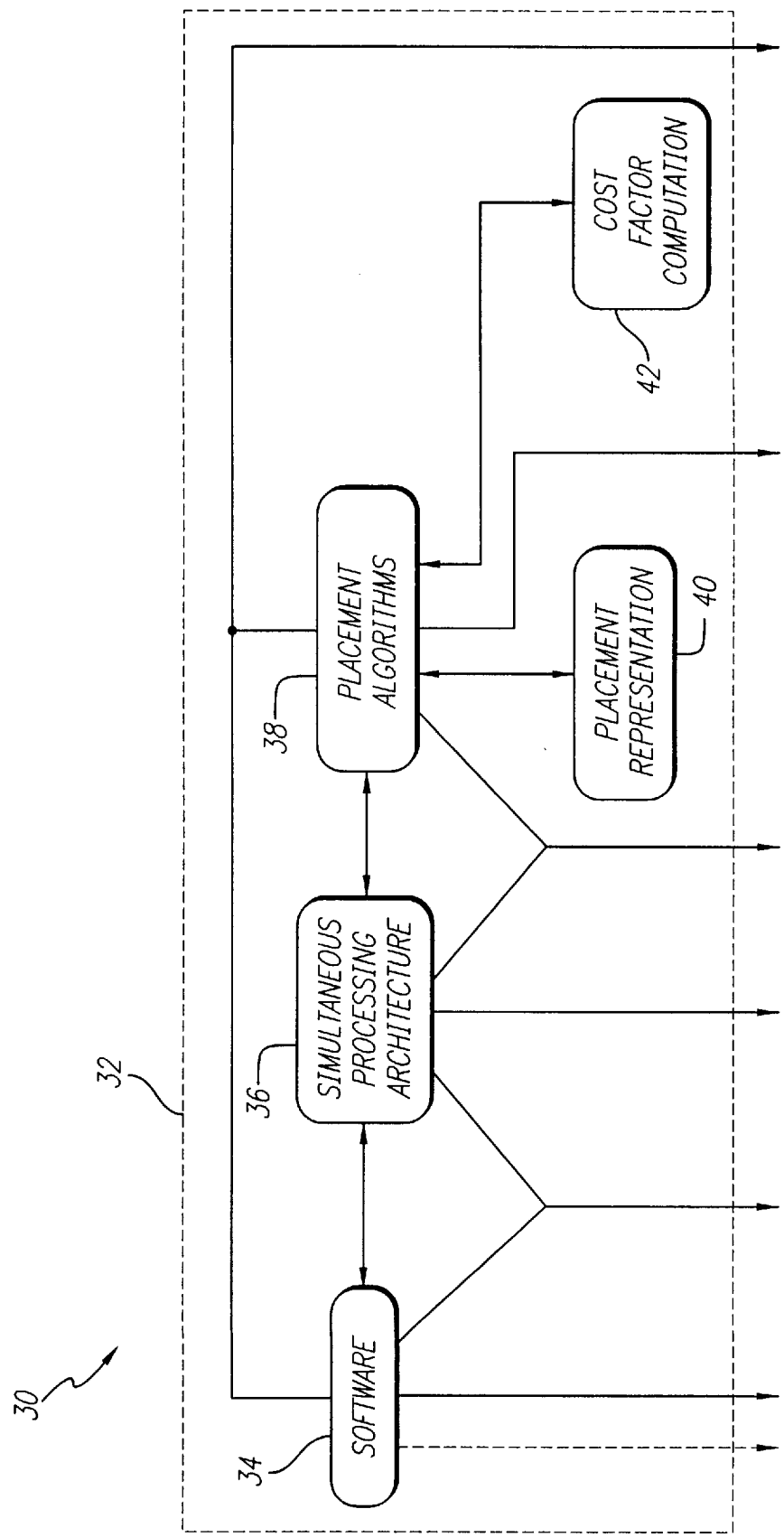
FIG. 2 is a diagram illustrating the main blocks of a multi-processing optimization system for practicing a method of the present invention.

FIG. 2 illustrates an integrated circuit physical design automation system 30 for producing an optimized placement of the cells 24 such as illustrated in FIG. 1 in accordance with a method of the present invention.

As will become evident from further description, system 30 is embodied as a programmed digital computer which generally comprises a processing means, memory means, and operating program which is stored in the memory means and executed by the processing means. The processing means preferably comprises a plurality of parallel processors for operating on a large number of areas of an integrated circuit cell placement concurrently.

The system 30 receives inputs for a user specified integrated circuit design including a netlist, a library of standardized microelectronic elements or cells and functional units including combinations of cells, and a set of rules that define the objectives of the design.

The architecture 36 collectively implements the required functionality of the present process by assigning different parallel processors to perform operations serially and/or concurrently, and combining the results thereof.

More specifically, the architecture 36 decomposes these functions into a plurality of parallel processes or tasks that are executed simultaneously using individual processing units. In general, one or more processors coordinate the operation of other processors, which are optimized, evaluated and recombined to produce an optimal cell placement which may or may not satisfy a predetermined performance objective.

The optimal cell placement produced by the system 30 is used to generate masks for fabrication of the desired integrated circuit chip.

The system 30 comprises a global operating system 32 that generally controls and coordinates the operation of parallel processing software 34 and simultaneous processing architecture 36.

The architecture 36 includes a plurality of parallel processors and a memory structure for simultaneously executing methodologies or placement algorithms 38 for measuring the relative costs of cell placements and minimizing the costs. Implementation of the algorithms 38 is facilitated by a cell placement representation 40 and cost function or factor computation 42. The architecture 36 can be of any type, such as Distributed Shared Memory (DSM), that enables parallel processing in accordance with the method of the invention.

Figure 4A:
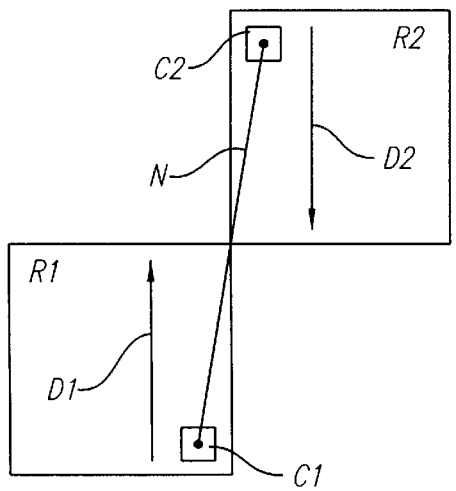
FIGS. 4a and 4b are similar to FIGS. 3a and 3b, illustrating how the prior art problem is solved in accordance with the present invention.
Figure 4B:
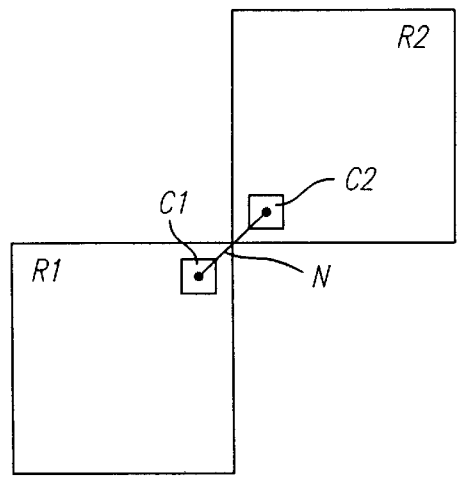

A fundamental principle of the present invention is illustrated in FIGS. 4a and 4b.

In accordance with the invention, an integrated circuit chip is divided into a plurality of rectangular or square regions of different types or "colors". Shown in the drawings are a region R1 and a region R2 which are diagonally offset (translated) relative to each other, and have a common vertex V.

Two cells C1 and C2 are located in the regions R1 and R2 respectively and are interconnected by a wiring net N. During a placement improvement operation such as simulated annealing, a processor of the architecture 36 working in the region R1 sees the cell C2 in the region R2, and moves the cell C1 in the direction of an arrow D1 toward the cell C2 to reduce the length of the net N. Similarly, a processor working in the region R2 sees the cell C1 in the region R1, and moves the cell C2 in the direction of an arrow D2 toward the cell C1 to reduce the length of the net N.

The result is illustrated in FIG. 4b. It will be seen that the length of the net N has been substantially reduced. The improvement is especially evident from a comparison of FIG. 4b with FIG. 3b.

The improvement of the invention is accomplished by defining the regions R1 and R2 such that they do not have a common side. Although an embodiment of the invention using rectangular (square) regions is shown in FIGS. 4a and 4b, it will be understood that the invention is not so limited, and that the regions can have other shapes such as triangular and hexagonal as will become apparent from further description.

Figure 5:
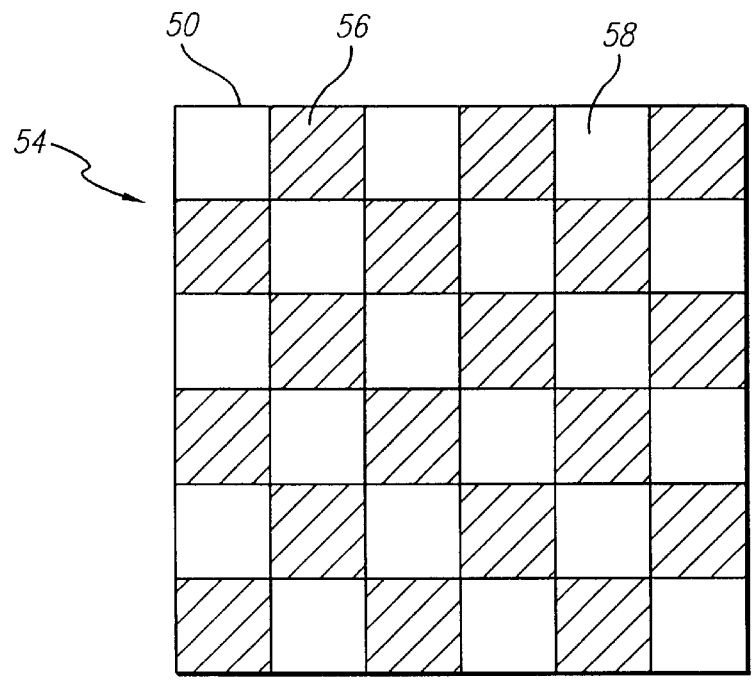
FIGS. 5 and 6 are diagrams illustrating two "jiggles" having rectangular "chessboard" patterns in accordance with the present invention.
Figure 6:
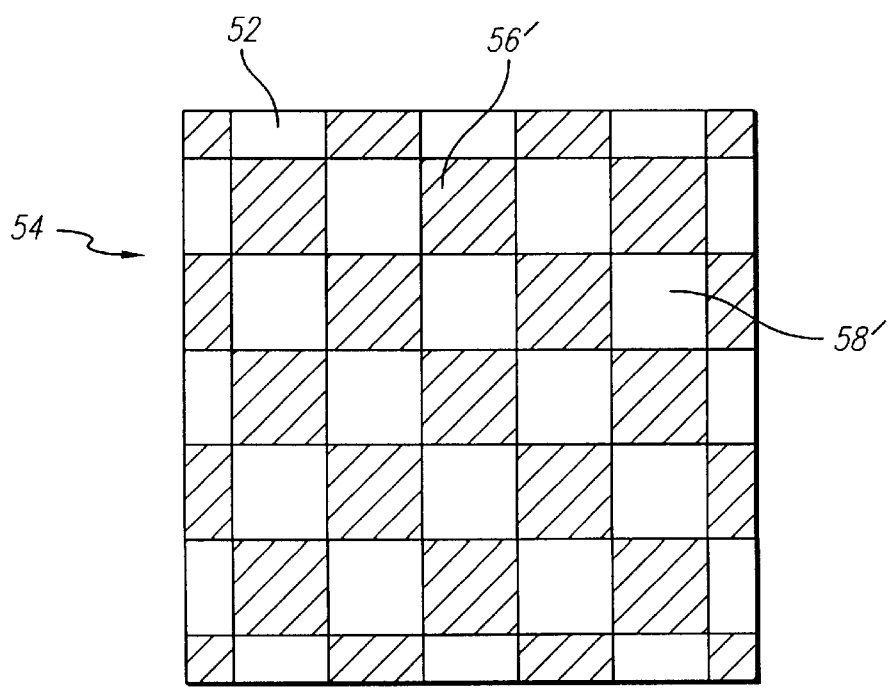

FIGS. 5 and 6 illustrated two "jiggles" 50 and 52 having "chessboard" patterns in accordance with the present invention. In FIG. 5, the entire area of an integrated circuit chip 54 is divided into a plurality of regions of two different types or "colors". The different colored regions comprise "black" regions 56 and "white" regions 58 which spatially alternate with each other such that no region of one color has an edge common with another region of the same color. The pattern of the jiggle 50 is identical to a chessboard (board used for playing the game "chess").

The jiggle 52 is similar to the jiggle 50, except that black and white regions 56' and 58' of the jiggle 52 are offset (translated) from the regions 56 and 58 of the jiggle 50. It will be noted that regions at the periphery of the jiggle 52 are half as large as those in the interior of the jiggle. This does not constitute a problem, since the jiggles 50 and 52 are considered as infinite meshes in accordance with the present invention.

Figure 7:
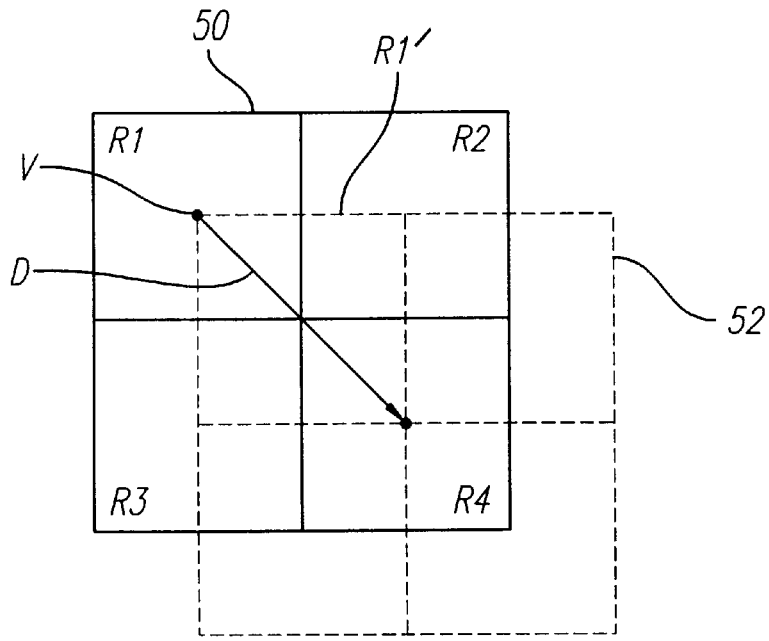
FIG. 7 is a diagram illustrating how the jiggle of FIG. 6 is translated from the jiggle of FIG. 5.

The relationship between the jiggles 50 and 52 is illustrated in FIG. 7. The jiggle 52 is translated diagonally (rightwardly and downwardly) relative to the jiggle 50 by one-half pitch (one-half the length of one side of a region) in the direction of an arrow D. The result of the translation is that the upper left vertex of a region R1' of the jiggle 52 is coincident with the center of a region R1 of the jiggle 50 as indicated at V.

Figure 8:
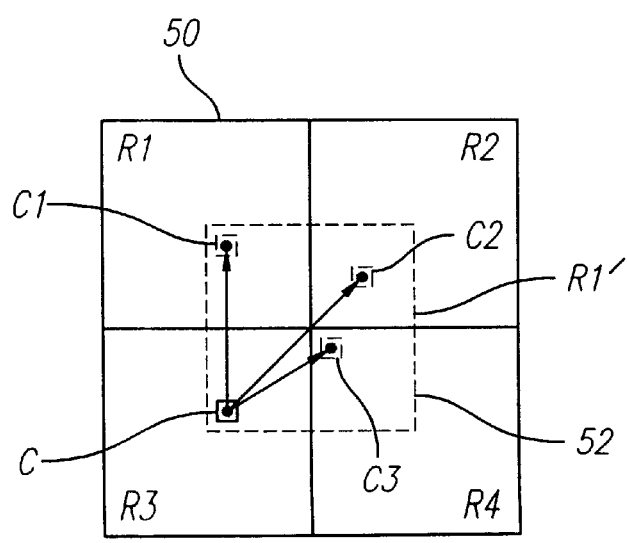
FIG. 8 is a diagram illustrating how a cell in one region can be moved to any of three adjacent regions.

As illustrated in FIG. 8, the region R1' of the jiggle 52 partially overlaps regions R1, R2, R3 and R4 of the jiggle 50. As a result, when a placement improvement operation is being locally performed in the region R1', any cell in the region R1' is able to move to any position within the region R1'. This enables a cell, for as illustrated at C, to move from an initial position in the region R3 of the jiggle 50 to exemplary locations C1, C2 and C3.

Although all of the locations C, C1, C2 and C3 are within the region R1' of the jiggle 52, they are in different regions R3, R1, R2 and R4 respectively in the jiggle 50. In this manner, a cell is able to move from one original region to another, and in fact move to any region on the entire chip.

This overcomes the limitation of the prior art in that, where placement improvement operations are being performed locally within regions, cells are not able to move from one region to another, even if their optimal locations are in regions far remote from their original regions.

Figure 9:
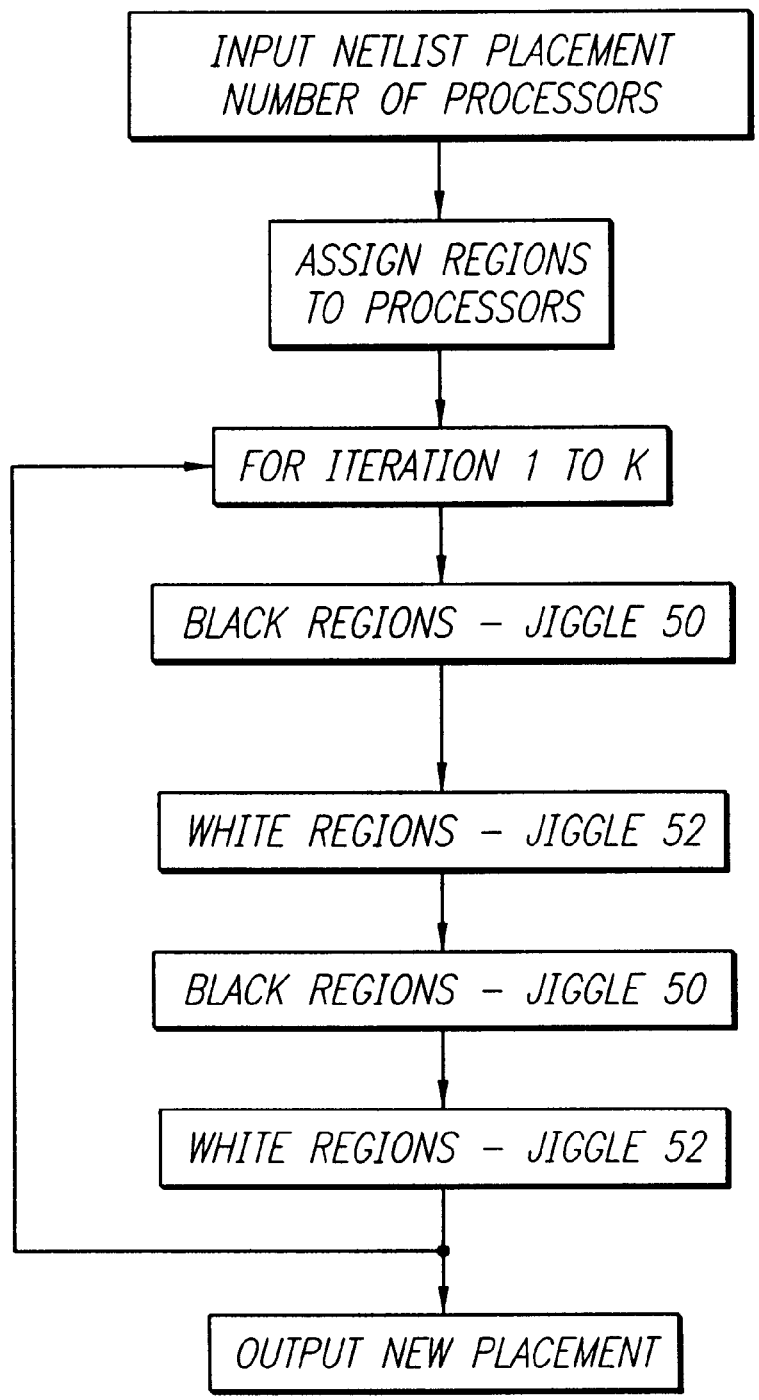
FIG. 9 is a flowchart illustrating a process according to the present invention.

A process embodying the present invention is illustrated in the form of a flowchart in FIG. 9. The first step is to input all required parameters, including an initial cell placement, interconnect netlist, and the number of processors that the architecture 36 has available for performing placement improvement or optimization operations.

Next, the chip is divided into the jiggles 50 and 52 as illustrated in FIGS. 5 and 6, and the processors are assigned to the regions. One processor can be assigned to one or more regions, with the load preferably balanced between the processors.

The processors are assigned such that each processor works on approximately the same region "capacity". The capacity can be defined in several ways, and is essentially based on the total number or area of cells in the regions to which a particular processor is assigned. It will be noted that a chip can include large macrocells or other areas which are not available for cell placement, and that these areas are not considered in assigning regions to processors.

If the cells can have different sizes and shapes, the capacity can be represented by the sum of the areas of the cells. If the cells, have the same width and can have different heights, the capacity can be represented by the total heights of the cells. If the cells are all identical, the capacity can be represented by the numbers of cells themselves.

If the cells are approximately evenly distributed over the chip, the processors can be assigned to pluralities of regions without taking into account the actual numbers or total areas of cells in each region. For example, if the number of processors is N, a jiggle will be defined as consisting of M×M square regions such that $M^2=4N$.

After the regions have been assigned to the processors, an iteration loop is performed K times, or alternatively until another predetermined end criterion is reached. For example, the end criterion can be such that the total wirelength of the placement is reduced below a predetermined value.

During each iteration of the loop, four optimization operations are performed on the colors of the jiggles. The optimization or placement improvement operation itself is not the particular subject matter of the invention, and can be, for example, simulated annealing.

The first operation is to perform the optimization operation in the black regions 56 of the jiggle 50. The operations are performed locally in the regions 56 using one processor assigned to each region, or one processor assigned to a plurality of regions as described above.

Prior to performing the operation, the architecture 36 generates a master copy of the entire cell placement on the chip, and distributes individual copies to all of the processors. Thus, each processor knows the position of every cell on the chip, and is able to perform local operations based on the master plan. After the operation is performed, the architecture 36 generates an updated master copy based on the local changes in the regions, and distributes updated individual copies to all of the processors.

In summary, a placement improvement operation based on a previous master copy of the placement is performed simultaneously in all of the black regions 56 of the jiggle 50 using parallel processors. The master copy is then updated to reflect the local changes and distributed to the processors.

The same procedure is then repeated on the white regions 58 of the jiggle 50, the black regions 56' of the jiggle 52, and the white regions 58' of the jiggle 52. The process then loops back and iterates until the end criterion is reached.

Figure 3A:
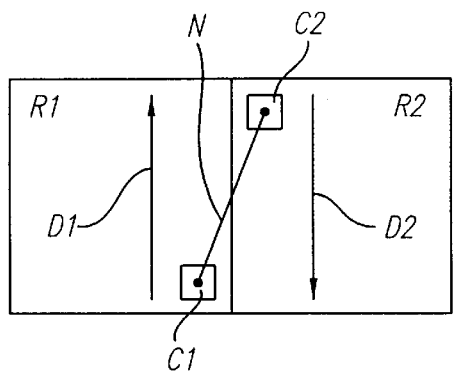
FIGS. 3a and 3b are diagrams illustrating a problem which has persisted in the prior art.
Figure 3B:
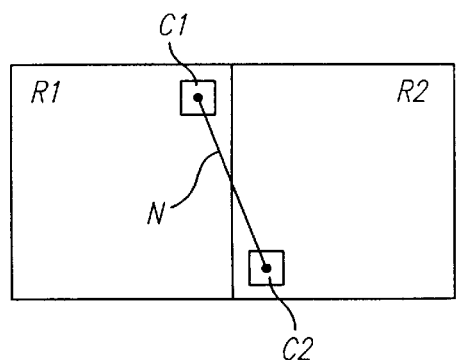

In this manner, unproductive cell moves are eliminated as described with reference to FIGS. 3a and 3b, and cells are able to move from an initial region to any other region on the chip as described with reference to FIG. 8. The result is that global optimization is accomplished using local optimizations which are performed simultaneously using parallel processors. Thus, the computation run time is greatly reduced, and the process is advantageous for commercial application.

The relative orientation of the jiggles 50 and 52 enables a cell in one region to move to locations in three adjacent regions. Thus, optimization can be accomplished using only two jiggles. However, the invention is not so limited, and different numbers of jiggles with different orientations can be used.

FIGS. 10 to 13 illustrate an embodiment of the present invention using three jiggles. As shown in FIG. 10, a second jiggle 62 (broken line) is translated horizontally from a first jiggle 60 (solid line) by one-half pitch, or one-half the length of a side of the regions of the jiggles 60 and 62 as indicated by an arrow D. In this manner, a cell C, for example, can move from an initial position as illustrated to anywhere in a region R1' which overlaps adjacent horizontal halves of regions R1 and R2 as shown in FIG. 11.

Although the cells can move between regions only in one direction, the amount of overlap is twice as much as in the embodiment of FIGS. 5 to 8.

Figure 12:
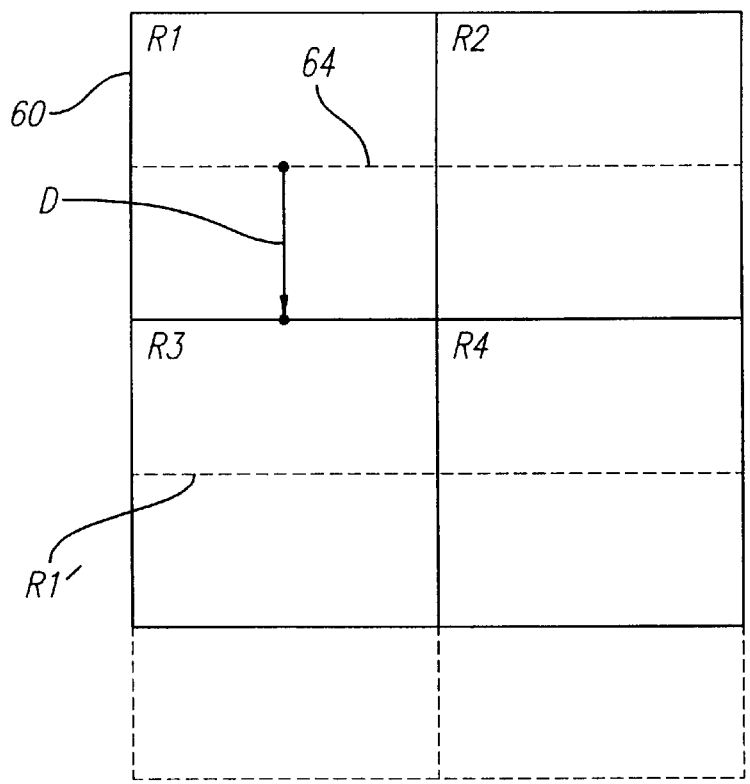
FIG. 12 is a diagram illustrating how the jiggle of FIG. 6 can be translated vertically from the jiggle of FIG. 5.
Figure 13:
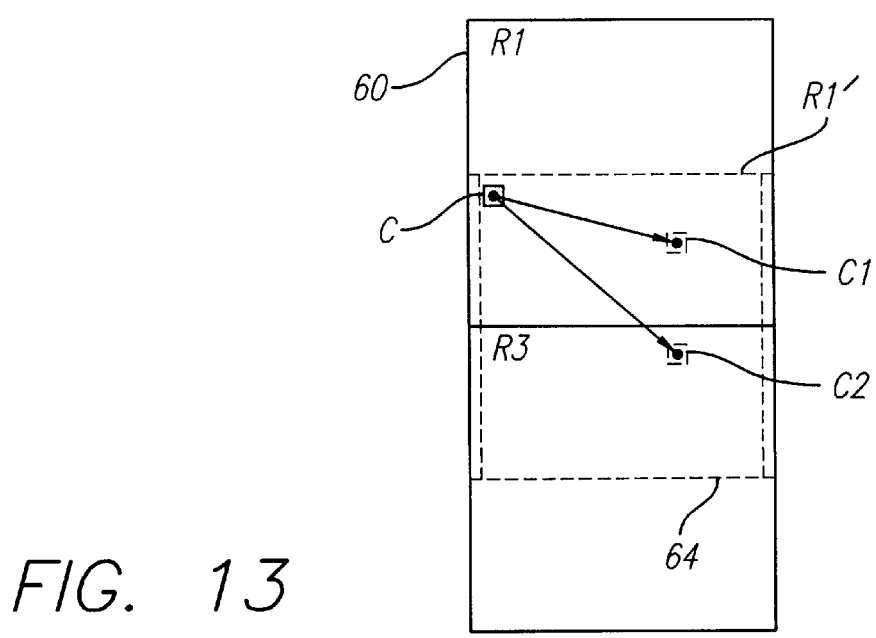
FIG. 13 is a diagram illustrating how a cell in one region can be moved to any of two adjacent regions.
Figure 14:
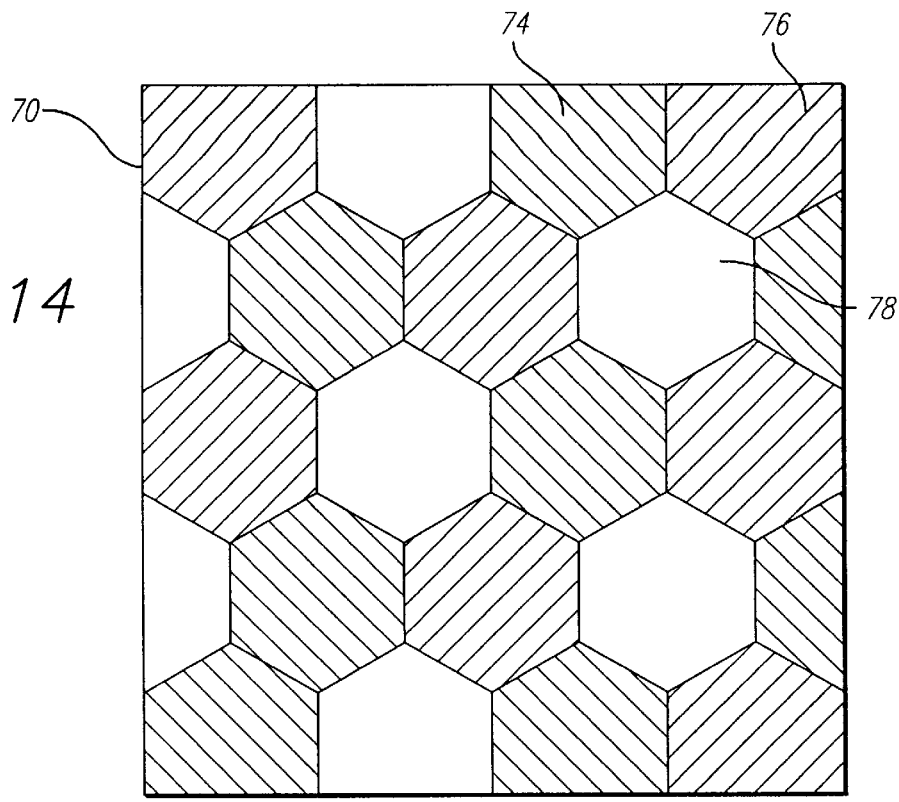
FIGS. 14 and 15 are diagrams illustrating two "jiggles" having hexagonal "chessboard" patterns in accordance with the present invention.

Cell movement in the vertical direction is enabled by a third jiggle 64 as illustrated in FIGS. 12 and 13. The jiggle 64 is translated from the jiggle 60 by one-half pitch in the vertical direction as indicated by an arrow D. In this manner, a cell C as shown in FIG. 13 can move to anywhere within adjacent overlapping vertical halves of the regions R1 and R3.

The present invention is not limited to a rectangular or square implementation as described above. For example, FIGS. 14 to 17 illustrate an embodiment of the invention using hexagonally shaped regions. More specifically, a jiggle 70 consists of hexagonal regions 74, 76 and 78 of different "colors". The regions 74 are represented by backwardly slanting hatching, the regions 76 are represented by forwardly slanting hatching, and the regions 78 are represented by no hatching.

As with the rectangular implementation, the regions 74, 76 and 78 spatially alternate with each other such that no region of a given color has an edge which is common with another region of the same color. Three regions are necessary due to the three directional symmetry of the hexagonal configuration.

Figure 15:
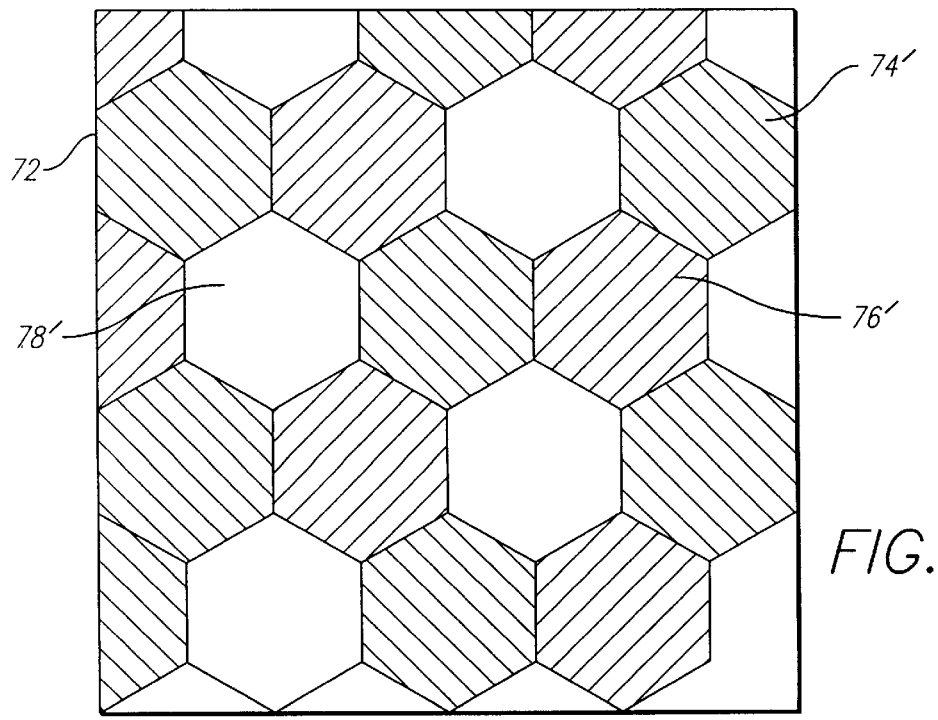
Figure 16:
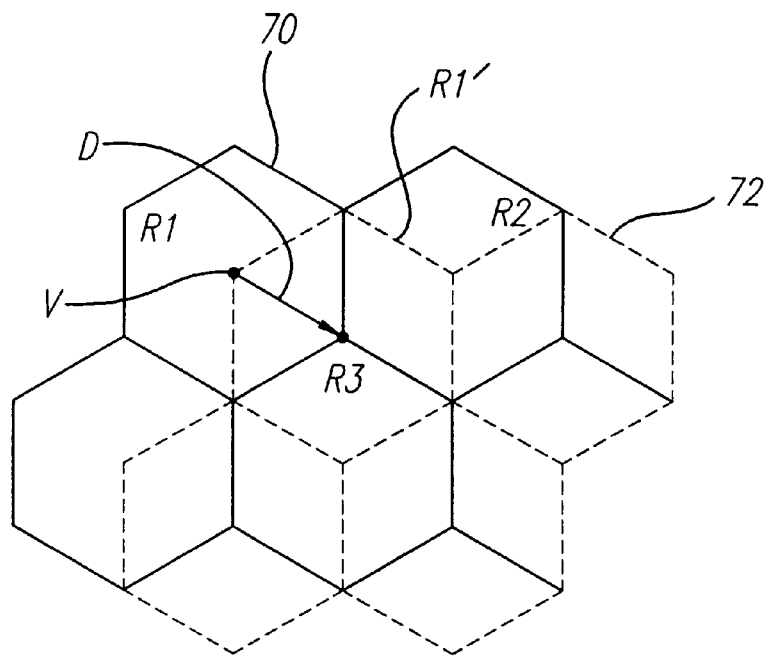
FIG. 16 is a diagram illustrating how the jiggle of FIG. 15 is translated from the jiggle of FIG. 14.

FIG. 15 illustrates a second jiggle 72 which is offset from the first jiggle 70 as illustrated in FIG. 16. More specifically, the jiggle 72 is translated in the direction of an arrow D such that a vertex of a region R1' of the jiggle 72 coincides with a center of a region R1 of the jiggle 70 as indicated at V. It will be noted that the arrow D extends parallel to the edges of the regions which slant rightwardly and downwardly as viewed in the drawing.

Figure 17:
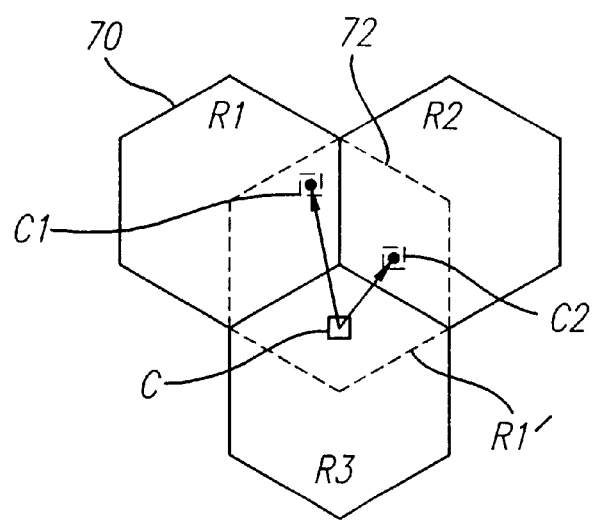
FIG. 17 is a diagram illustrating how a cell in one region can be moved to any of two adjacent regions.

The overlap provided by the jiggles 70 and 72 is illustrated in FIG. 17. A cell C, for example, is able to move from an initial location in the region R3 to locations C1 and C2 in the regions R1 and R2 respectively.

As with the rectangular embodiment of the invention, the hexagonal configuration can be implemented with more than two jiggles. FIGS. 18 to 23 illustrate an embodiment using four jiggles.

Figure 18:
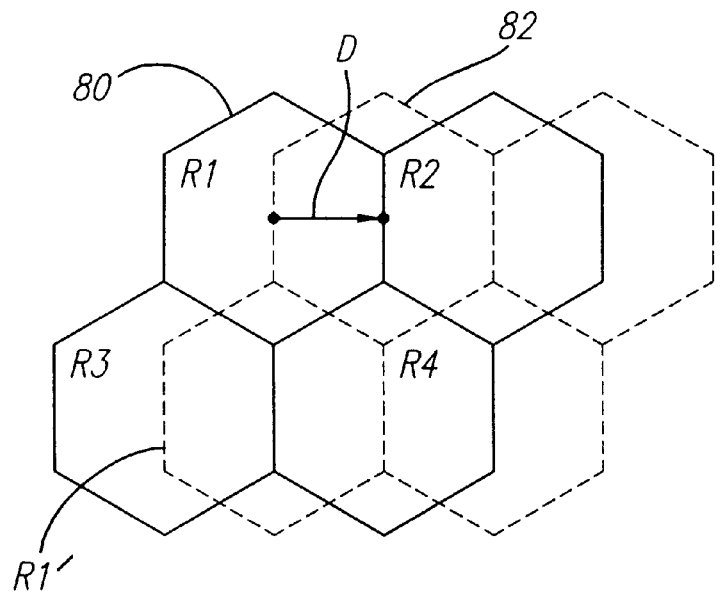
FIG. 18 is a diagram illustrating how the jiggle of FIG. 15 can be translated horizontally from the jiggle of FIG. 14.
Figure 19:
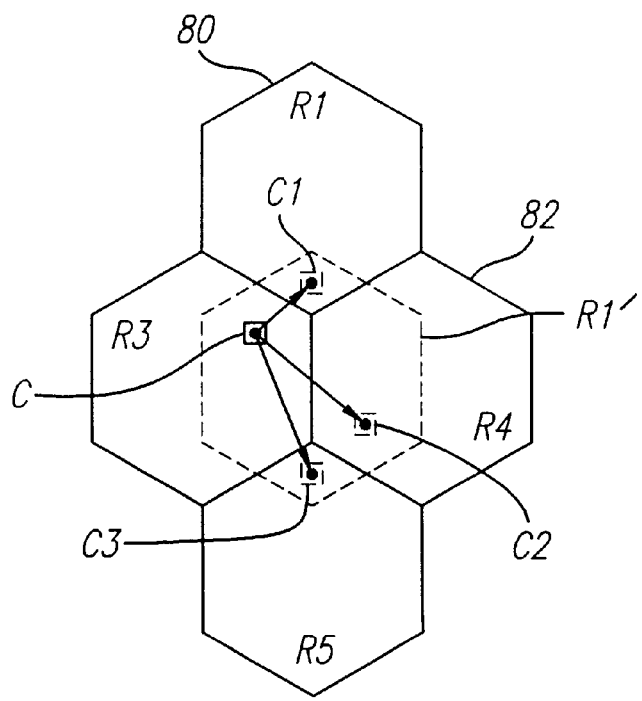
FIG. 19 is a diagram illustrating how a cell in one region can be moved to any of three adjacent regions.

In FIG. 18, a second jiggle 82 is translated horizontally from a first jiggle as indicated by an arrow D. The arrow D extends perpendicular to the vertical edges of the regions. The amount of translation is one-half pitch, or one-half the distance between two parallel edges of a region. As illustrated in FIG. 19, a region R1' of the jiggle 82 overlaps regions R1, R3, R4 and R5 of the jiggle 80 such that a cell C, for example, can move to locations C1, C2 and C3 in the regions R1, R4 and R5 respectively. It will be noted that the amount of horizontal overlap is greater than the amount of vertical overlap.

Figure 20:
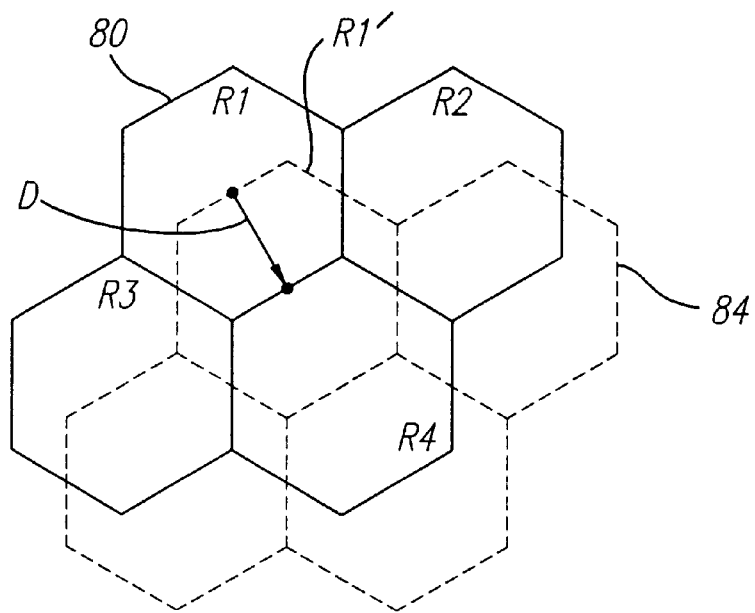
FIG. 20 is a diagram illustrating how the jiggle of FIG. 15 can be translated rightward and downward from the jiggle of FIG. 14.
Figure 21:
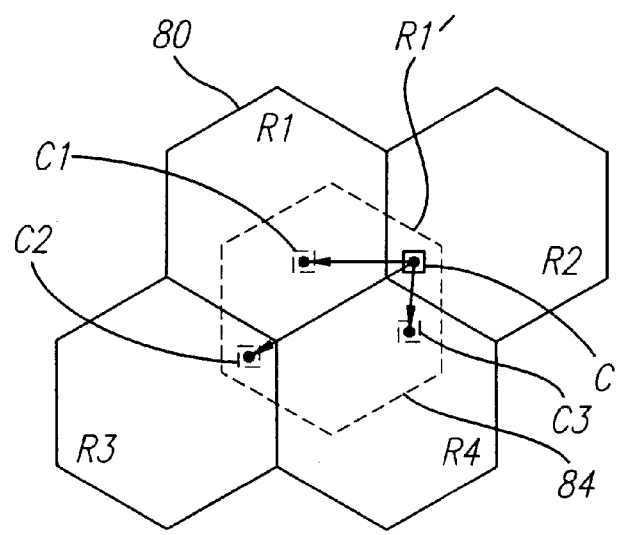
FIG. 21 is a diagram illustrating how a cell in one region can be moved to any of three adjacent regions.

FIG. 20 illustrates a third jiggle 84 which is translated downwardly and rightwardly from the jiggle 80 as indicated by an arrow D. The translation is perpendicular to the edges of the regions which slant rightwardly and upwardly. FIG. 21 illustrates the overlap, and possible movement of a cell C to locations C1, C2 and C3. The overlap asymmetry is similar to that of FIGS. 18 and 19, but rotated clockwise by 60°.

Figure 22:
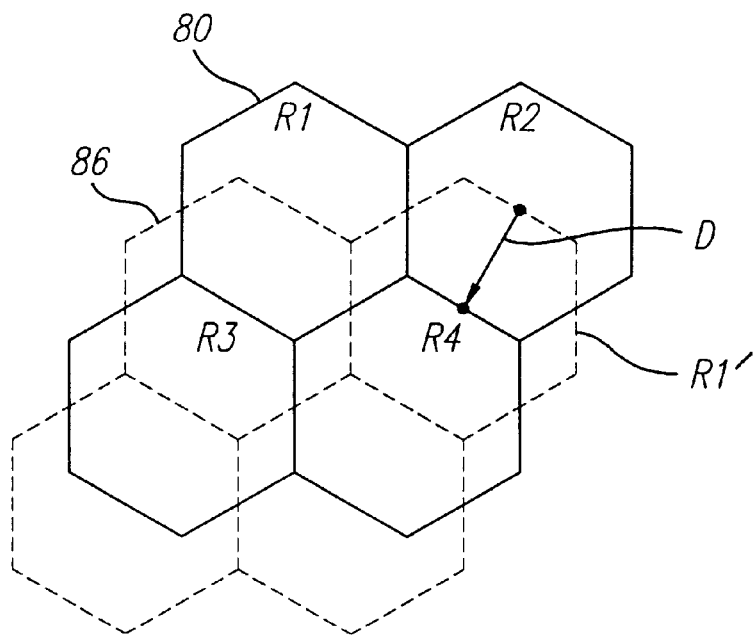
FIG. 22 is a diagram illustrating how the jiggle of FIG. 15 can be translated leftward and downward from the jiggle of FIG. 14.
Figure 23:
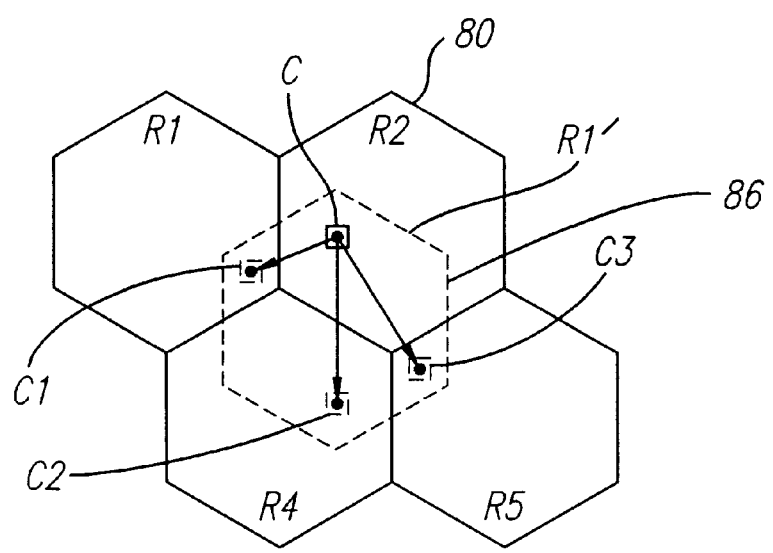
FIG. 23 is a diagram illustrating how a cell in one region can be moved to any of three adjacent regions.
Figure 24:
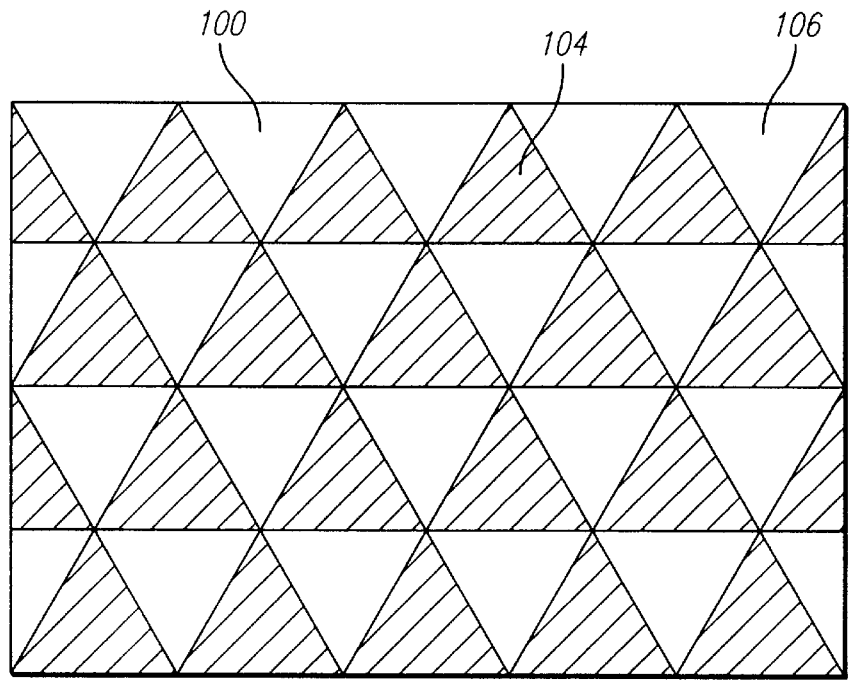
FIGS. 24 and 25 are diagrams illustrating two "jiggles" having triangular "chessboard" patterns in accordance with the present invention.

FIG. 22 illustrates a fourth jiggle 86 which is translated leftwardly and downwardly from the jiggle 80 as indicated by an arrow D. The translation is perpendicular to the edges of the regions which slant rightwardly and downwardly. FIG. 23 illustrates the overlap, and possible movement of a cell C to locations C1, C2 and C3. The overlap asymmetry is similar to that of FIGS. 18 and 19, but rotated clockwise by 210°.

FIGS. 24 to 27b illustrate an embodiment of the invention using equilateral triangle shaped regions. More specifically, a jiggle 100 consists of triangluar regions 104 and 106 of different "colors".

As with the rectangular implementation, the regions 104 and 106 spatially alternate with each other such that no region of a given color has an edge which is common with another region of the same color.

Figure 25:
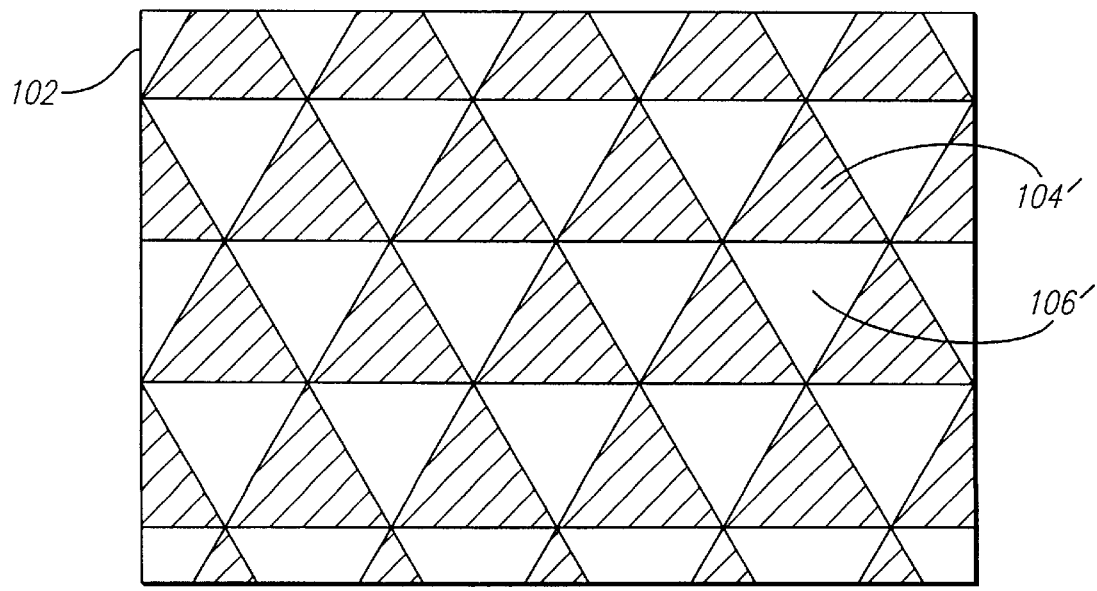
Figure 26:
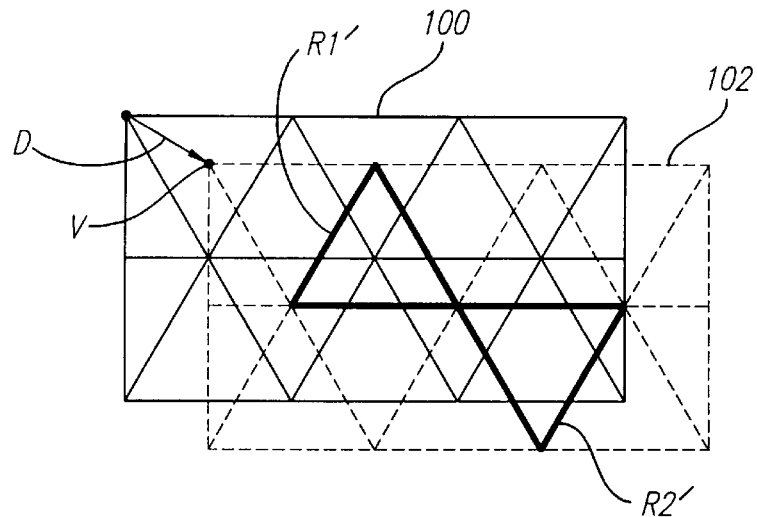
FIG. 26 is a diagram illustrating how the jiggle of FIG. 25 is translated from the jiggle of FIG. 24.

FIG. 25 illustrates a second jiggle 102 which is offset from the first jiggle 100 as illustrated in FIG. 26. More specifically, the jiggle 102 is translated in the direction of an arrow D such that a vertex of a region of the jiggle 102 coincides with a center of a region of the jiggle 100 as indicated at V. The center of an equilateral triangle is defined as the intersection of lines extending from the vertices to the midpoints of the opposite sides.

It will be noted that the arrow D extends perpendicular to the edges of the regions which slant upwardly and rightwardly as viewed in the drawing. The displacement angle is 30° clockwise, and the amount of displacement is S/sqr(3), where S is the length of a side of the regions, and "sqr" denotes "square root".

Figure 27A:
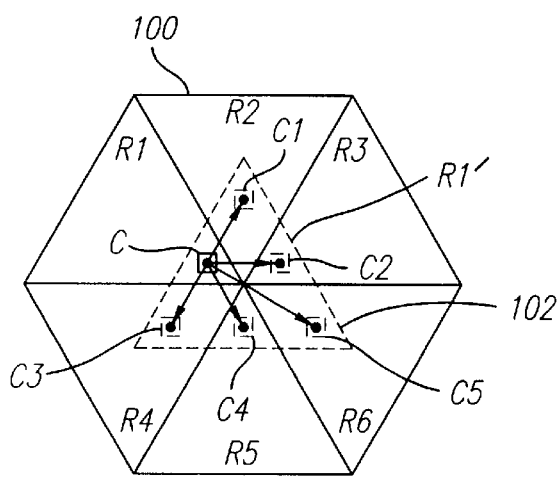
FIG. 27 is a diagram illustrating how a cell in one region can be moved to any of five adjacent regions.
Figure 27B:
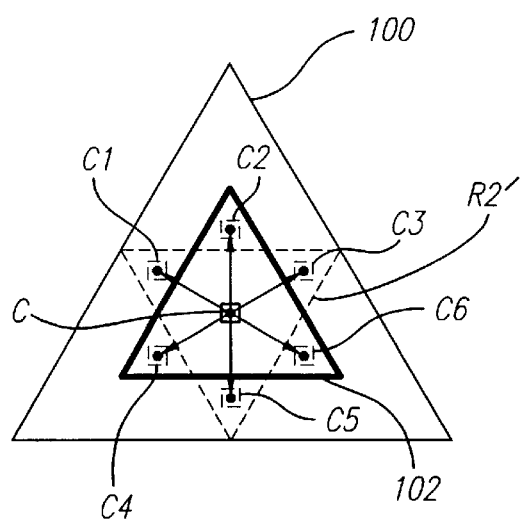

The overlap provided by the jiggles 100 and 102 is illustrated in FIGS. 27a and 27b. A cell C, for example, is able to move from an initial location in a region R1 to locations C1 to C5 in regions R2, R3, R4, R5 and R6 respectively which are overlapped by a region R1' of the jiggle 102.

In other words, overlap is provided for six adjacent regions. It will be noted that the overlap is greater for three of the regions than for the alternating three regions. FIG. 27b shows how a region R2' of the jiggle 102 which overlaps the regions of the jiggle 100 in a different manner also enable a cell C to move to locations C1 to C6 in different regions of the jiggle 100.

As with the rectangular embodiment of the invention, the triangular configuration can be implemented with more than two jiggles. FIGS. 28 to 33 illustrate an embodiment using four jiggles.

Figure 28:
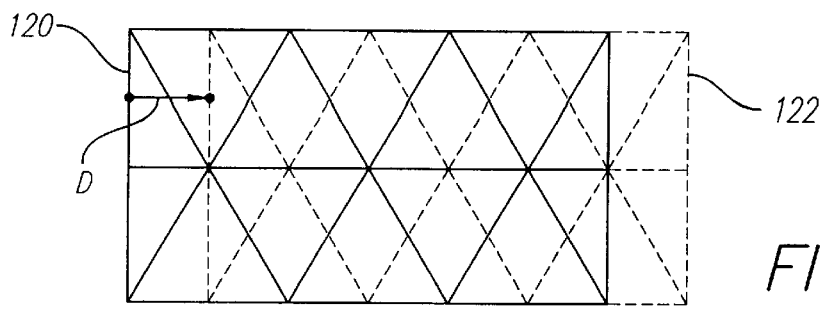
FIG. 28 is a diagram illustrating how the jiggle of FIG. 25 can be translated horizontally from the jiggle of FIG. 24.
Figure 29:
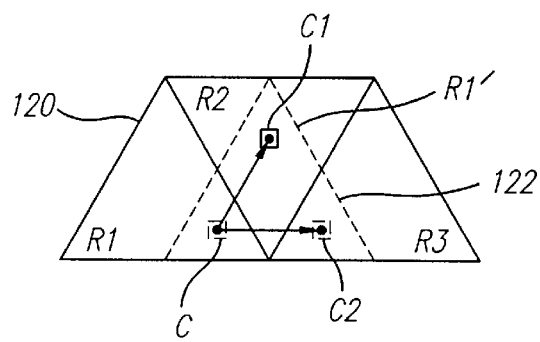
FIG. 29 is a diagram illustrating how a cell in one region can be moved to any of two adjacent regions.

In FIG. 28, a second jiggle 122 is translated horizontally from a first jiggle 120 as indicated by an arrow D. The amount of translation is one-half pitch, or one-half the length of a side S of the regions. As illustrated in FIG. 29, a region R1' of the jiggle 122 overlaps regions R1, R2, and R3 of the jiggle 120 such that a cell C, for example, can move to locations C1 and C2. It will be noted that the amount of vertical overlap is greater than the amount of horizontal overlap.

Figure 30:
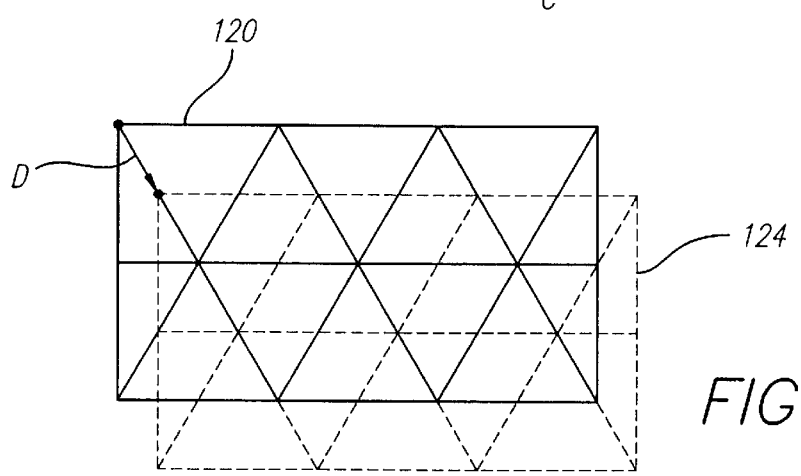
FIG. 30 is a diagram illustrating how the jiggle of FIG. 25 can be translated rightward and downward from the jiggle of FIG. 24.
Figure 31:
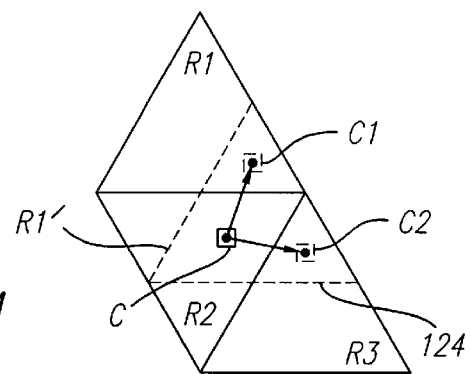
FIG. 31 is a diagram illustrating how a cell in one region can be moved to any of two adjacent regions.

FIG. 30 illustrates a third jiggle 124 which is translated downwardly and rightwardly from the jiggle 120 as indicated by an arrow D. The translation is parallel to the edges of the regions which slant rightwardly and downwardly. FIG. 31 illustrates the overlap, and possible movement of a cell C to locations C1 and C2. The overlap asymmetry is similar to that of FIGS. 18 and 19, but rotated clockwise by 60°.

Figure 32:
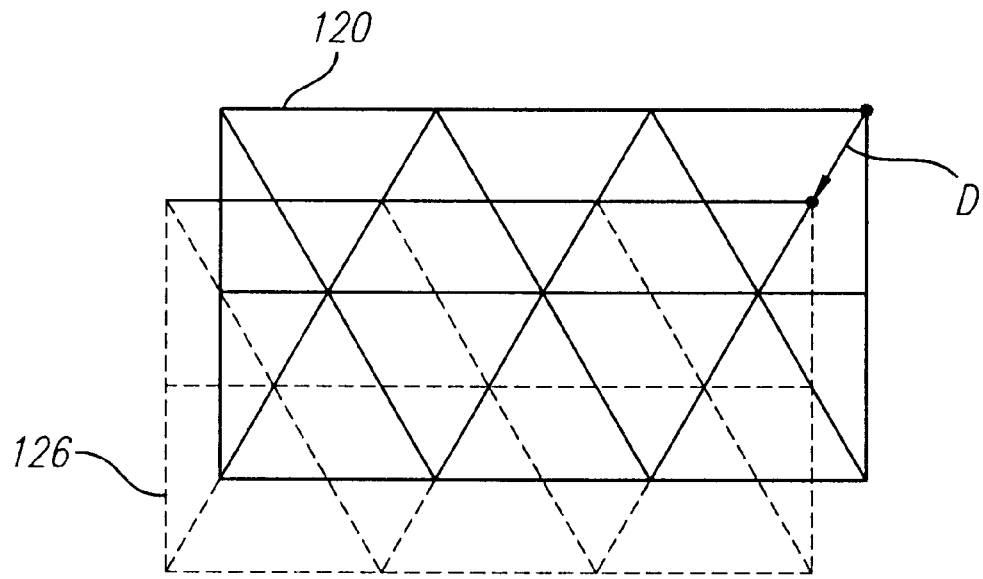
FIG. 32 is a diagram illustrating how the jiggle of FIG. 25 can be translated leftward and downward from the jiggle of FIG. 24.
Figure 33:
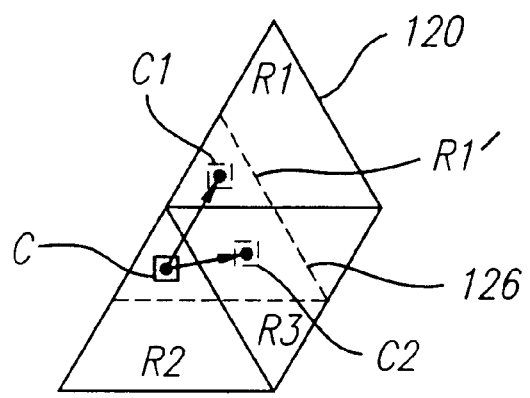
FIG. 33 is a diagram illustrating how a cell in one region can be moved to any of two adjacent regions.

FIG. 32 illustrates a fourth jiggle 126 which is translated leftwardly and downwardly from the jiggle 120 as indicated by an arrow D. The translation is parallel to the edges of the regions which slant leftwardly and downwardly. FIG. 33 illustrates the overlap, and possible movement of a cell C to locations C1 and C2. The overlap asymmetry is similar to that of FIGS. 28 and 29, but rotated clockwise by 210°.

Various modifications will become possible for those skilled in the art after receiving the teachings of the present disclosure without departing from the scope thereof.

For example, it is within the scope of the invention to provide regions which are not regular, such as rectangles having an aspect ratio other than zero, non-regular hexagons, and non-equilateral triangles. It is also within the scope of the invention to provide the jiggles having regions having different sizes than the regions of other jiggles.

We claim:

1. A process for designing an integrated circuit chip, comprising the steps of:
   (a) providing a placement of cells on the chip;
   (b) dividing at least a portion of the chip into a set of first regions and, at the same time, a set of second regions that spatially alternate with the first regions;
   (c) performing a first placement improvement operation on cells in at least two of the first regions, without performing said first placement improvement operation on cells in the second regions; and
   (d) performing a second placement improvement operation on cells in at least two of the second regions, without performing said second placement improvement operation on cells in the first regions,
   wherein said first placement improvement operation is completed before said second placement improvement operation is begun.

2. A process as in claim 1, further comprising the step of:
   (e) repeating steps (c) and (d) until a predetermined criterion is reached.

3. A process as in claim 2, in which said predetermined criterion comprises performing steps (c) and (d) a predetermined number of times.

4. A process as in claim 1, in which the first regions do not have edges that are common to edges of other first regions, and the second regions do not have edges that are common to edges of other second regions.

5. A process as in claim 1, in which the first and second regions have rectangular shapes.

6. A process as in claim 5, in which the first and second regions have a same shape.

7. A process as in claim 6, in which edges of the first regions are common to edges of adjacent second regions.

8. A process as in claim 1, in which:
   step (b) further comprises dividing the chip into a set of third regions that spatially alternate with the first and second regions; and
   step (d) further comprises performing a third placement improvement operation on cells in the third regions.

9. A process as in claim 8, in which the third regions do not have edges that are common to edges of other third regions.

10. A process as in claim 9, in which edges of the first regions are common to edges of adjacent second and third regions, edges of the second regions are common to edges of adjacent first and third regions, and edges of the third regions are common to edges of adjacent first and second regions.

11. A process as in claim 10, in which the first, second and third regions have triangular shapes.

12. A process as in claim 11, in which the first, second and third regions have a same shape.

13. A process as in claim 10, in which the first, second and third regions have hexagonal shapes.

14. A process as in claim 13, in which the first, second and third regions have a same shape.

15. A process as in claim 1, further comprising the steps of:
- (e) dividing the chip into a set of third regions, and a set of fourth regions that spatially alternate with the third regions, such that the third regions overlap the first and second regions, and the fourth regions also overlap the first and second regions;
- (f) performing a third placement improvement operation on cells in the third regions; and
- (g) performing a fourth placement improvement operation on cells in the fourth regions.

16. A process as in claim 15, in which the first, second, third and fourth regions have rectangular shapes.

17. A process as in claim 16, in which the first, second, third and fourth regions have a same shape.

18. A process as in claim 17, in which edges of the first regions are common to edges of adjacent second regions, and edges of the third regions are common to edges of adjacent fourth regions.

19. A process as in claim 18, in which the third and fourth regions are translated from the first and second regions by one-half of a pitch of said regions.

20. A process as in claim 18, in which the third and fourth regions are translated from the first and second regions such that a vertex of a third region is coincident with a center of a first region.

21. A process as in claim 15, in which:
- step (b) further comprises dividing the chip into a set of fifth regions that spatially alternate with the first and second regions, and a set of sixth regions that spatially alternate with the third and fourth regions, such that the fifth regions overlap the third and fourth regions, and the sixth regions overlap the first and second regions; and
- step (d) further comprises performing a fifth placement improvement operation on cells in the fifth and sixth regions.

22. A process as in claim 21, in which:
- the fifth regions do not have edges that are common to edges of other fifth regions; and
- the sixth regions do not have edges that are common to edges of other sixth regions.

23. A process as in claim 22, in which:
- edges of the first regions are common to edges of adjacent second and fifth regions, edges of the second regions are common to edges of adjacent first and fifth regions, and edges of the fifth regions are common to edges of adjacent first and second regions; and
- edges of the third regions are common to edges of adjacent fourth and sixth regions, edges of the fourth regions are common to edges of adjacent third and sixth regions, and edges of the sixth regions are common to edges of adjacent third and fourth regions.

24. A process as in claim 23, in which the first, second, third, fourth, fifth and sixth regions have triangular shapes.

25. A process as in claim 24, in which the first, second, third, fourth, fifth and sixth regions have a same shape.

26. A process as in claim 25, in which said same shape is an equilateral triangle.

27. A process as in claim 25, in which the third, fourth and sixth regions are translated from the first, second and fifth regions such that a vertex of a third region is coincident with a center of a first region.

28. A process as in claim 23, in which the first, second, third, fourth, fifth and sixth regions have hexagonal shapes.

29. A process as in claim 28, in which the first, second, third, fourth, fifth and sixth regions have a same shape.

30. A process as in claim 29, in which said same shape is a regular hexagon.

31. A process as in claim 30, in which the third, fourth and sixth regions are translated from the first, second and fifth regions such that a vertex of a third region is coincident with a center of a first region.

32. A process as in claim 1, in which steps (c) and (d) comprise performing said first and second placement improvement operations on pluralities of the first and second regions simultaneously using pluralities of parallel processors respectively.

33. A process as in claim 32, further comprising the step of:
- (e) assigning approximately equal total areas of cells to the parallel processors respectively.

34. A process as in claim 32, further comprising the step of:
- (e) assigning approximately equal numbers of regions to the parallel processors respectively.

35. A process as in claim 32, in which:
- steps (c) and (d) comprise performing said first and second placement improvement operations based on a copy of the entire chip; and
- the method further comprises the steps of:
  - after performing step (c), updating said copy; and
  - after performing step (d), updating said copy.

36. A programmed digital computer for designing an integrated circuit chip, comprising:
- memory means for storing a program including instructions and data; and
- processing means for executing the program;
- the processing means, memory means and program for operating in combination for performing the steps of:
  - (a) providing a placement of cells on the chip;
  - (b) dividing at least a portion of the chip into a set of first regions and, at the same time, a set of second regions that spatially alternate with the first regions;
  - (c) performing a first placement improvement operation on cells in at least two of the first regions, without performing said first placement improvement operation on cells in the second regions; and
  - (d) performing a second placement improvement operation on cells in at least two of the second regions, without performing said second placement improvement operation on cells in the first regions,
  - wherein said first placement improvement operation is completed before said second placement improvement operation is begun.

37. A programmed digital computer as in claim 36, in which the processing means, memory means and program operating in combination further perform the step of:
- (e) repeating steps (c) and (d) until a predetermined criterion is reached.

38. A programmed digital computer as in claim 37, in which said predetermined criterion comprises performing steps (c) and (d) a predetermined number of times.

39. A programmed digital computer as in claim 36, in which the first regions do not have edges that are common to edges of other first regions, and the second regions do not have edges that are common to edges of other second regions.

40. A programmed digital computer as in claim 36, in which the first and second regions have rectangular shapes.

41. A programmed digital computer as in claim 40, in which the first and second regions have a same shape.

42. A programmed digital computer as in claim 41, in which edges of the first regions are common to edges of adjacent second regions.

43. A process according to claim 1, wherein the second regions spatially alternate with the first regions in two dimensions.

44. A programmed digital computer according to claim 36, wherein the second regions spatially alternate with the first regions in two dimensions.

45. Computer-executable process steps stored on a computer readable medium, said process steps for designing an integrated circuit chip, said process steps comprising steps to:

(a) provide a placement of cells on the chip;

(b) divide at least a portion of the chip into a set of first regions and, at the same time, a set of second regions that spatially alternate with the first regions;

(c) perform a first placement improvement operation on cells in at least two of the first regions, without performing said first placement improvement operation on cells in the second regions; and (d) perform a second placement improvement operation on cells in at least two of the second regions, without performing said second placement improvement operation on cells, in the first regions, wherein said first placement improvement operation is completed before said second placement improvement operation is begun.

46. Computer-executable process steps according to claim 45, wherein the second regions spatially alternate with the first regions in two dimensions.

* * * * *